US010135026B2

United States Patent
Moon et al.

(10) Patent No.: US 10,135,026 B2
(45) Date of Patent: Nov. 20, 2018

(54) DISPLAY DEVICE AND METHOD OF MANUFACTURING THE SAME

(71) Applicant: Samsung Display Co., Ltd., Yongin-si (KR)

(72) Inventors: Byung Rok Moon, Asan-si (KR); Jae Hyun Kim, Asan-si (KR); Shogo Nishizaki, Suwon-si (KR); Seok Hoon Seo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/627,388

(22) Filed: Jun. 19, 2017

(65) Prior Publication Data

US 2018/0226610 A1  Aug. 9, 2018

(30) Foreign Application Priority Data

Feb. 9, 2017  (KR) ........................ 10-2017-0018293

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3276* (2013.01); *H01L 51/56* (2013.01)

(58) Field of Classification Search
CPC . H01L 51/5253; H01L 51/56; H01L 27/3276; H01L 27/1214; H01L 27/3244–27/3279; H01L 27/1251
See application file for complete search history.

(56) References Cited

U.S. PATENT DOCUMENTS

| 7,538,354 B2 | 5/2009 | Hayashi et al. |
| 8,772,824 B2 | 7/2014 | Lee et al. |
| 9,095,016 B2 | 7/2015 | Kwack et al. |
| 2015/0187854 A1* | 7/2015 | Beak ................... H01L 27/3262 257/40 |
| 2017/0262109 A1* | 9/2017 | Choi ..................... G06F 3/0412 |
| 2017/0278901 A1* | 9/2017 | Kim .................... H01L 51/0097 |

FOREIGN PATENT DOCUMENTS

KR  10-0843181  7/2008

* cited by examiner

*Primary Examiner* — Selim Ahmed
(74) *Attorney, Agent, or Firm* — H.C. Park & Associates, PLC

(57) ABSTRACT

Provided are a display device and a method for manufacturing the same. According to exemplary embodiments, a display device includes a substrate in which a display area and a non-display area disposed outside the display area are defined, an interlayer insulating film disposed on the substrate, a passivation film disposed on the interlayer insulating film, an anode disposed on the passivation film, an intermediate layer disposed on the anode, a cathode disposed on the intermediate layer, a capping layer disposed on the cathode, and an encapsulation film disposed on the capping layer.

14 Claims, 18 Drawing Sheets

DISPLAY DEVICE AND METHOD OF MANUFACTURING THE SAME

CROSS-REFERENCE TO RELATED APPLICATION

This application claims priority from and the benefit of Korean Patent Application No. 10-2017-0018293, filed on Feb. 9, 2017, which is hereby incorporated by reference for all purposes as if fully set forth herein.

BACKGROUND

Field

Exemplary embodiments relate to a display device and a method of manufacturing the same.

Discussion of the Background

With the development of multimedia entertainment, the importance of display devices is increasing. Accordingly, various types of display devices such as liquid crystal displays (LCDs) and organic light-emitting displays (OLEDs) are being used.

An OLED includes a hole-injecting electrode, an electron-injecting electrode, and an organic light-emitting diode formed between the hole-injecting electrode and the electron-injecting electrode and including an organic light-emitting layer. Holes injected from the hole-injecting electrode and electrons injected from the electron-injecting electrode recombine in an organic light-emitting layer to generate excitons. The OLED is a self-luminous display device which emits light as the excitons drop from an excited state to a ground state.

Being self-luminous, OLEDs do not require a separate light source. Therefore, OLEDs can be driven at a low voltage and can be made light and thin. In addition, OLEDs have high-quality characteristics such as a wide viewing angle, high contrast, and fast response speed. Due to these characteristics, OLEDs are drawing attention as next-generation display devices.

However, since OLEDs are deteriorated by external moisture or oxygen, an organic light-emitting diode should be sealed to protect the organic light-emitting diode from external moisture or oxygen. To make an OLED thinner and/or flexible, thin-film encapsulation (TFE) composed of a plurality of inorganic films or a plurality of layers including an organic film and an inorganic film is being used. Here, as the thickness of the inorganic film increases, penetration of moisture or oxygen from the outside can be effectively prevented. However, the increased thickness of the inorganic film increases the stress of the inorganic film, thereby causing peeling of the inorganic film. When the peeling of the inorganic film occurs, external moisture or oxygen may penetrate an organic light-emitting diode, thereby reducing the life of the (MED.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device in which adhesion between an encapsulation film and a substrate is maintained stably.

Exemplary embodiments also provide a method of manufacturing a display device in which adhesion between an encapsulation film and a substrate is maintained stably.

Additional aspects will be set forth in the detailed description which follows, and, in part, will be apparent from the disclosure, or may be learned by practice of the inventive concept.

According to exemplary embodiments, a display device includes a substrate in which a display area and a non-display area disposed outside the display area are defined, an interlayer insulating film disposed on the substrate, a passivation film disposed on the interlayer insulating film, an anode disposed on the passivation film, an intermediate layer disposed on the anode, a cathode disposed on the intermediate layer, a capping layer disposed on the cathode, and an encapsulation film disposed on the capping layer.

According to another exemplary embodiment, a method of manufacturing a display device includes preparing a substrate having an interlayer insulating film, a passivation film and an anode and in which a display area and a non-display area are defined; forming an intermediate layer on the anode, forming a cathode on the intermediate layer, forming a capping layer on the cathode, and forming an encapsulation film on the capping layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
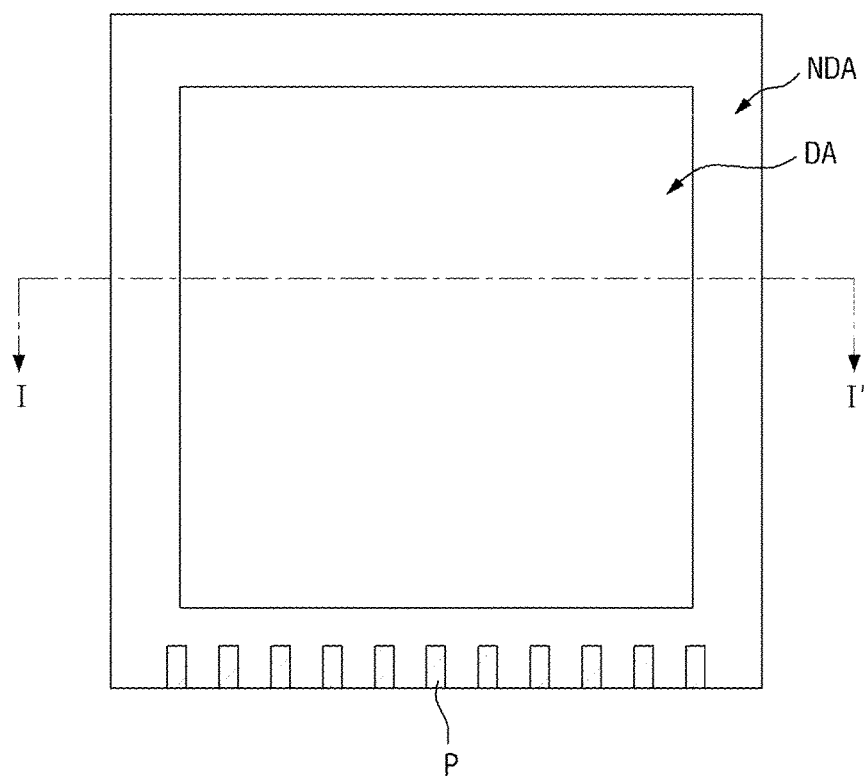
FIG. 1 is a schematic layout diagram according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
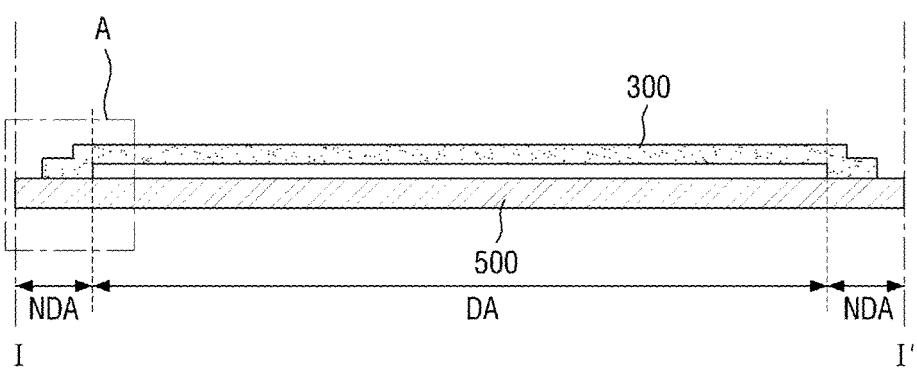
FIG. 2 is a cross-sectional view taken along the line IT of FIG. 1.
Figure 3:
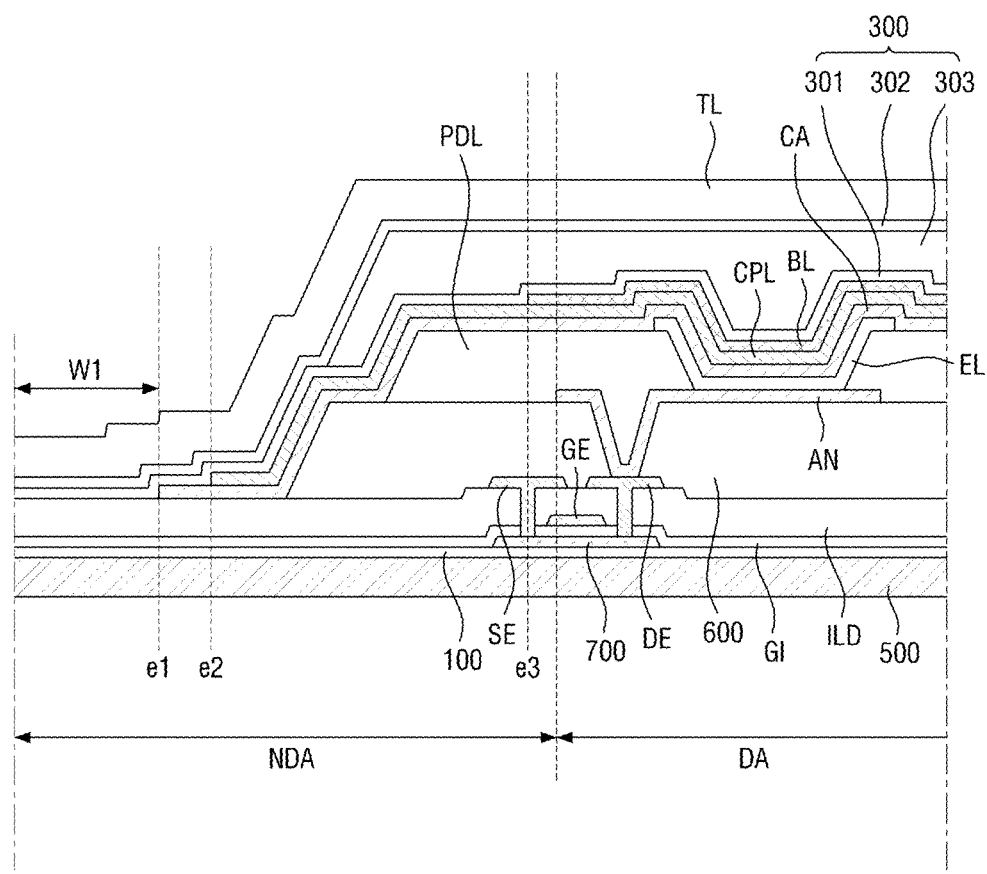
FIG. 3 is a partial enlarged view of a portion 'A' of FIG.

FIG. 1 is a schematic layout diagram according to an embodiment. FIG. 2 is a cross-sectional view taken along the line I-I' of FIG. 1. FIG. 3 is a partial enlarged view of a portion 'A' of FIG.

Referring to FIGS. 1 and 3, a display device according to an exemplary embodiment includes a substrate 500 having a display area DA and a non-display area NDA disposed outside the display area DA, an interlayer insulating film ILD disposed on the substrate 500, a passivation film 600 disposed on the interlayer insulating film ILD, an anode AN disposed on the passivation film 600, an intermediate layer EL disposed on the anode AN, a cathode CA disposed on the intermediate layer EL, a capping layer CPL disposed on the cathode CA, and an encapsulation film 300 disposed on the capping layer CPL.

The substrate 500 may be an insulating substrate and include one or more of polyimide, polyethylene terephthalate (PET), polycarbonate, polyethylene naphtalate, polyarylate (PAR), and polyetherimide. However, the above materials are merely examples, and the material of the substrate 500 is not limited to these examples. In an exemplary embodiment, the substrate 500 may include a material such as metal or glass. In an exemplary embodiment, the substrate 500 may be a flexible substrate. In other words, the substrate 500 may be a flexible substrate that can be bent, rolled, and folded.

The display area DA and the non-display area NDA may be defined in the substrate 500. The display area. DA may be an area which displays an image, and the non-display area NDA may be an area where various signal lines or power lines are arranged so that the display area DA can display an image.

A plurality of pixels (not illustrated) may be defined in the display area DA, and at least one thin-film transistor and an organic light-emitting diode may be disposed in one pixel. The thin-film transistor and the organic light-emitting diode will be described in greater detail later.

A plurality of pads P may be formed on a side of the non-display area NDA. In an exemplary embodiment, the display device may further include a power supply (not illustrated) or a signal generator (not illustrated), and an electrical signal provided by the power supply or the signal generator may be transmitted to the display area DA via the pads P.

A buffer layer 100 may be disposed on the substrate 500. In an exemplary embodiment, the buffer layer 100 may be formed on the entire surface of the substrate 500. In other words, the buffer layer 100 may cover both the display area DA and the non-display area NDA of the substrate 500. The buffer layer 100 may prevent penetration of impurities through the substrate 500 and planarize an upper surface of the substrate 500.

In an exemplary embodiment, the buffer layer 100 may include one or more of silicon oxide, silicon nitride, silicon oxynitride, aluminum oxide, aluminum nitride, titanium oxide, and titanium nitride.

In an exemplary embodiment, the buffer layer 100 may include one or more of polyimide, polyester, and acrylic.

In FIG. 3, the buffer layer 100 is illustrated as a single layer. However, the structure of the buffer layer 100 is not limited to the single layer. In an exemplary embodiment, the buffer layer 100 may be a stack of a plurality of functional films.

A semiconductor pattern layer 700 may be disposed on the buffer layer 100. In an exemplary embodiment, the semiconductor pattern layer 700 may include an inorganic semiconductor such as amorphous silicon or polysilicon. In an embodiment, the semiconductor pattern layer 700 may include an organic semiconductor or an oxide semiconductor.

In an exemplary embodiment, the semiconductor pattern layer 700 may include a source region (not illustrated) and a drain region (not illustrated). A source electrode SE to be described later may be electrically connected to the source region of the semiconductor pattern layer 700, and a drain electrode DE to be described later may be electrically connected to the drain region of the semiconductor pattern layer 700.

A gate insulating film GI may be disposed on the semiconductor pattern layer 700. The gate insulating film GI may be formed on the entire surface of the substrate 500. In other words, the gate insulating film GI may be formed over the display area DA and the non-display area NDA. In an exemplary embodiment, the gate insulating film GI may include any one or more of silicon nitride, silicon oxide, and silicon oxynitride.

A gate electrode GE may be disposed on the gate insulating film GI. The gate electrode GE may include any one or more of an aluminum (Al)-based metal including an aluminum alloy, a silver (Ag)-based metal including a silver alloy, a copper (CO-based metal including a copper alloy, a molybdenum (Mo)-based metal including a molybdenum alloy, chrome (Cr), titanium (Ti), and tantalum (Ta).

The interlayer insulating film ILD covering the gate electrode GE may be disposed on the gate electrode GE. The interlayer insulating film ILD may be formed on the entire surface of the substrate 500. That is, the interlayer insulating film ILD may be formed over the display area DA and the non-display area NDA and overlap the gate insulating film GI.

The interlayer insulating film ILD may include one or more of silicon nitride, silicon oxide, and silicon oxynitride.

In FIG. 3, the interlayer insulating film ILD is illustrated as a single film. However, the interlayer insulating film ILD is not necessarily a single film. That is, in an embodiment, the interlayer insulating film ILD may be a stack of two or more functional layers.

The source electrode SE and the drain electrode DE may be disposed on the interlayer insulating film ILD. Specifically, the interlayer insulating film ILD may expose the source region and the drain region of the semiconductor pattern layer 700, and the source electrode SE and the drain electrode DE may contact the semiconductor pattern layer 700 through the exposed source and drain regions. Accordingly, each of the source electrode SE and the drain electrode DE may be electrically connected to the semiconductor pattern layer 700. That is, the gate electrode GE, the source electrode SE, and the drain electrode DE may form a thin-film transistor.

The thin-film transistor may be a driving transistor for driving an organic light-emitting diode OLED.

In FIG. 3, a top gate-type display device in which the gate electrode GE is disposed on the semiconductor pattern layer 700 is illustrated. However, the inventive concept is not limited to the top gate-type display device. In an embodiment, the display device may employ a bottom gate type in which the gate electrode GE is disposed under the semiconductor pattern layer 700.

The passivation film 600 may be disposed on the source electrode SE, the drain electrode DE, and the interlayer insulating film ILD. The passivation film 600 may partially cover the interlayer insulating film ILD. In addition, the passivation film 600 may partially expose the drain electrode DE.

The anode AN, the intermediate layer EL and the cathode CA may be disposed on the passivation film 600. That is, the anode AN, the intermediate layer EL and the cathode CA may form an organic light-emitting diode.

The anode AN may be formed on the passivation film 600 and may contact the drain electrode DE exposed by the passivation film 600. That is, the anode AN may be electrically connected to the drain electrode DE.

In an exemplary embodiment, the anode AN may be a reflective electrode and include one or more reflective films made of one or more of Ag, Mg, Al, Pt, Pd, Au, Ni, Nd, Ir and Cr and a transparent or semitransparent electrode formed on the reflective films.

The transparent or semitransparent electrode may include any one or more of indium tin oxide (ITO), indium zinc oxide (IZO), zinc oxide (ZnO), indium oxide ($In_2O_3$), indium gallium oxide (IGO), and aluminum zinc oxide (AZO).

A pixel defining layer PDL made of an insulating material may be disposed on the anode AN. The pixel defining layer PDL may expose at least part of the anode AN.

The intermediate layer EL may be disposed on the anode AN exposed by the pixel defining layer PDL. The intermediate layer EL may include an organic light-emitting layer made of a low molecular weight or high molecular organic material. In an exemplary embodiment, the intermediate layer EL may further include one or more of a hole transfer layer (HTL), a hole injection layer (HIL), an electron transfer layer (ETL), and an electron injection layer (EIL).

The cathode CA may be disposed on the anode AN. In an exemplary embodiment, the cathode CA may be formed as a whole-surface electrode on the entire surface of the substrate 500. That is, the cathode CA may be formed over the display area DA and the non-display area NDA, and the anode AN may be disposed only in the display area DA. In an exemplary embodiment, the cathode CA may be a transparent electrode or a semitransparent electrode. The cathode CA may include any one or more of Li, Ca, LiF/Ca, Ag, and Mg. Also, the cathode CA may be made of a metal thin film having a low work function. The transparent or semitransparent electrode may include any one or more of indium tin oxide (ITO), indium zinc oxide (IZO), zinc oxide (ZnO), indium oxide ($In_2O_3$), indium gallium oxide (IGO), and aluminum zinc oxide (AZO).

In an exemplary embodiment, the display device may be a top emission-type display device in which light generated from the intermediate layer EL is emitted toward the cathode CA.

In another exemplary embodiment, the display device may be a bottom emission-type display device in which light generated from the intermediate layer EL is emitted toward the anode AN. In this case, the cathode CA may be a reflective electrode, and the anode AN may be a transparent or semitransparent electrode.

In yet another exemplary embodiment, the display device may be a double-sided emission-type display device in which light generated from the intermediate layer EL is emitted toward the anode AN and the cathode CA.

The capping layer CPL covering the cathode CA may be disposed on the cathode CA. The capping layer CPL may include one or more of a-NPD, NPB, TPD, m-MTDATA, Alq3, and CuPc. The capping layer CPL may protect the organic light-emitting diode and efficiently guide light received from the intermediate layer EL.

In an exemplary embodiment, the capping layer CPL may be formed over the display area DA and the non-display area NDA. An end e2 of the capping layer CPL and an end e1 of the cathode CA may be disposed in the non-display area NDA. The end e2 of the capping layer CPL may be disposed relatively further inside than the end e1 of the cathode CA.

For ease of description, directions will be defined. When an element is disposed on an inner side, it means that the element is disposed relatively close to the center of the display area DA. When an element is disposed on an outer side, it means that the element is disposed relatively close to an outermost end of the substrate 500. Accordingly, the capping layer CPL may expose a portion including the end e1 of the cathode CA. A protective layer BL may also be disposed on the capping layer CPL.

In an exemplary embodiment, the protective layer BL may include any one or more of LiF, MgF2, and CaF2. The protective layer BL may prevent, (e.g., plasma) from penetrating the organic light-emitting diode and causing damage in the process of forming a first inorganic film 301.

In an exemplary embodiment, an end e3 of the protective layer BL may be disposed in the non-display area NDA. In addition, the protective layer BL may completely cover the intermediate layer EL.

The first inorganic film 301 may be disposed on the protective layer BL. The first inorganic film 301 may include any one or more of silicon oxide (SiOx), silicon nitride (SiNx), and silicon oxynitride (SiONx).

In FIG. 3, the first inorganic film 301 is illustrated as a single layer. However, the structure of the first inorganic film 301 is not limited to the single layer. In an exemplary embodiment, the first inorganic film 301 may be a stack of a plurality of functional films. In another exemplary embodiment, the first inorganic film 301 may be an alternate stack of a film made of silicon oxide (SiOx) and a film made of silicon nitride (SiNx).

The first inorganic film 301 may be formed on the entire surface of the substrate 500. In other words, the first inorganic film 301 may be formed over the display area DA and the non-display area NDA of the substrate 500. The first inorganic film 301 may have a thickness of 10000 Å, an end of the first inorganic film 301 may be disposed further outside than the end e1 of the cathode CA, and the end of the first inorganic film 301 may be aligned with an end of the substrate 500.

Accordingly, the first inorganic film 301 may directly contact the protective layer BL, the capping layer CPL and the cathode CA. Specifically, the first inorganic film 301 may directly contact the cathode CA exposed by the capping layer CPL.

The first inorganic film 301 may directly contact the interlayer insulating film ILD. In an exemplary embodiment, a first width w1 by which the first inorganic film 301 contacts the interlayer insulating film ILD may be 50 to 300 μm. At least a minimum contact area may be required for stable adhesion between the encapsulation film 300 and the substrate 500. When the end e2 of the capping layer CPL is disposed further inside than the end e1 of the cathode CA as in the exemplary embodiment, a sufficient contact area between the interlayer insulating film ILD and the first inorganic film 301 can be ensured, thus making it possible to maintain the stable adhesion between the encapsulation film 300 and the substrate 500.

A first organic film 303 may be disposed on the first inorganic film 301. The first organic film 303 may be formed on the first inorganic film 301 and may have a thickness of 30000 Å so as to planarize step portions formed by the pixel defining layer PDL.

In an exemplary embodiment, the first organic film 303 may include any one of epoxy, acrylate, and urethane acrylate. A width of the first organic film 303 may be smaller than that of the first inorganic film 301. Accordingly, a second inorganic film 302 disposed on the first organic film 303 may directly contact the first organic film 303 and the first inorganic film 301. The second inorganic film 302 may be disposed on the first organic film 303. The second inorganic film 302 may include any one or more of silicon oxide (SiOx), silicon nitride (SiNx), and silicon oxynitride (SiONx).

In FIG. 3, the second inorganic film 302 is illustrated as a single layer. However, the structure of the second inorganic film 302 is not limited to the single layer. In an exemplary embodiment, the second inorganic film 302 may be an alternate stack of a film made of silicon oxide (SiOx) and a film made of silicon nitride (SiNx).

In an exemplary embodiment, the second inorganic film 302 may be formed on the entire surface of the substrate 500, and an end of the second inorganic film 302 may be aligned with the end of the substrate 500.

In FIG. 3, the end of the first inorganic film 301 and the end of the second inorganic film 302 are aligned with each other. However, the inventive concept is not limited to this case.

In an exemplary embodiment, the end of the second inorganic film 302 may be disposed further outside than the end of the first inorganic film 301. In this case, the second inorganic film 302 may directly contact the interlayer insulating film ILD on the substrate 500.

A touch layer TL may be disposed on the encapsulation film 300. A touch input can be received through the touch layer TL, and an input touch signal may be transmitted to the non-display area NDA and/or the display area DA.

To this end, the touch layer TL may include a plurality of functional films and a plurality of transistors. A detailed description of the structure of the touch layer TL will be omitted to not obscure the scope of the inventive concept.

In an exemplary embodiment, the touch layer TL may be formed on the entire surface of the substrate 500. Accordingly, the touch layer TL may completely cover the second inorganic film 302.

Hereinafter, display devices according to other exemplary embodiments will be described. In the following exemplary embodiments, elements identical to those described above are indicated by like reference numerals, and thus their description will be omitted or given briefly.

Figure 4:
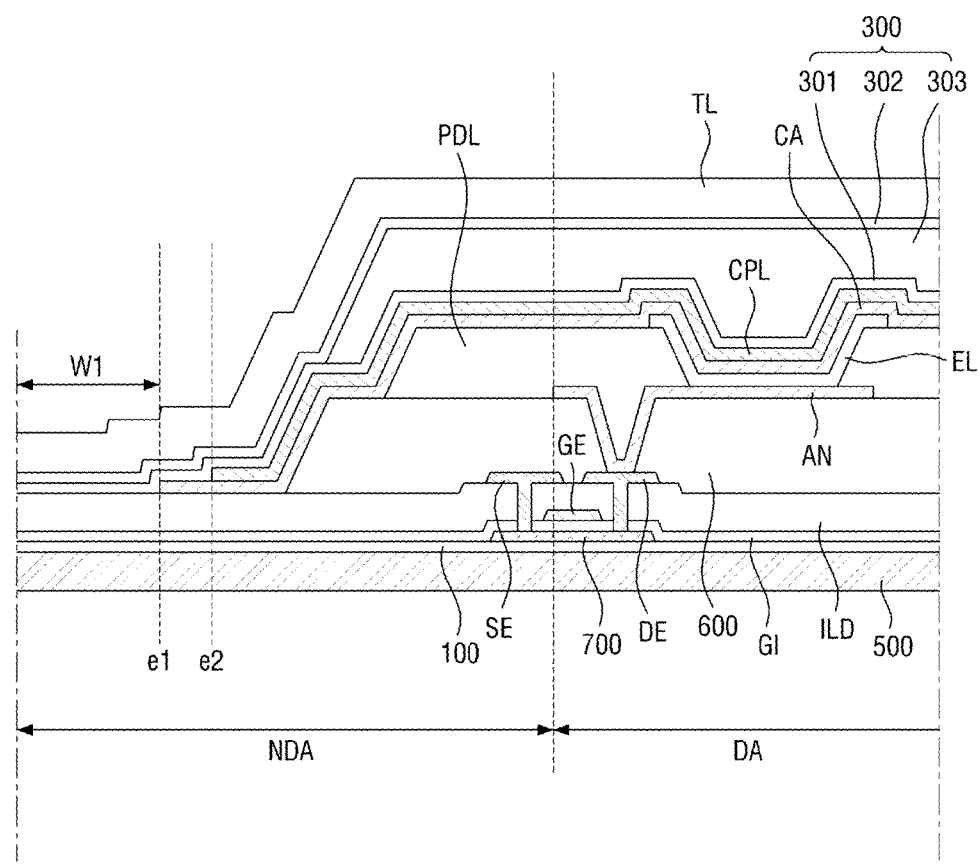
FIG. 4 is a cross-sectional view of a display device according to an exemplary embodiment.

FIG. 4 is a cross-sectional view of a display device according to an embodiment.

Referring to FIG. 4, the display device according to this embodiment is different from the display device according to the exemplary embodiment of FIG. 3 in that a protective layer BL is omitted.

In an embodiment, the protective layer BL may be omitted. In this case, a capping layer CPL overlapping an intermediate layer EL may directly contact a first inorganic film 301.

Figure 5:
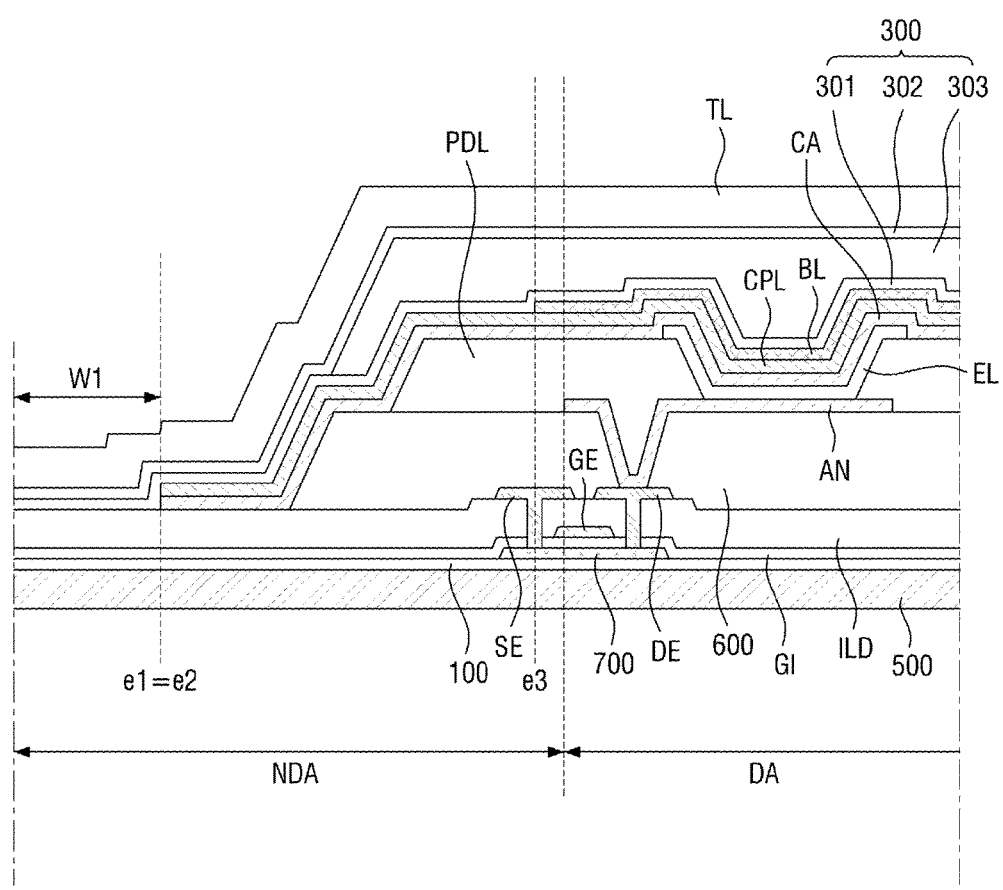
FIG. 5 is a cross-sectional view of a display device according to an exemplary embodiment.

FIG. 5 is a cross-sectional view of a display device according to an exemplary embodiment.

Referring to FIG. 5, the display device according to this exemplary embodiment is different from the display device according to the exemplary embodiment of FIG. 3 in that an end e1 of a cathode CA and an end e2 of a capping layer CPL are aligned with each other.

In this exemplary embodiment, the end e1 of the cathode CA and the end e2 of the capping layer CPL may be aligned with each other. Even in this case, a first inorganic film 301 may directly contact the cathode CA and the capping layer CPL. Specifically, even when the end e1 of the cathode CA and the end e2 of the capping layer CPL are aligned with each other, the capping layer CPL does not completely cover the cathode CA. Accordingly, the end e1 of the cathode CA may directly contact the first inorganic film 301.

Figure 6:
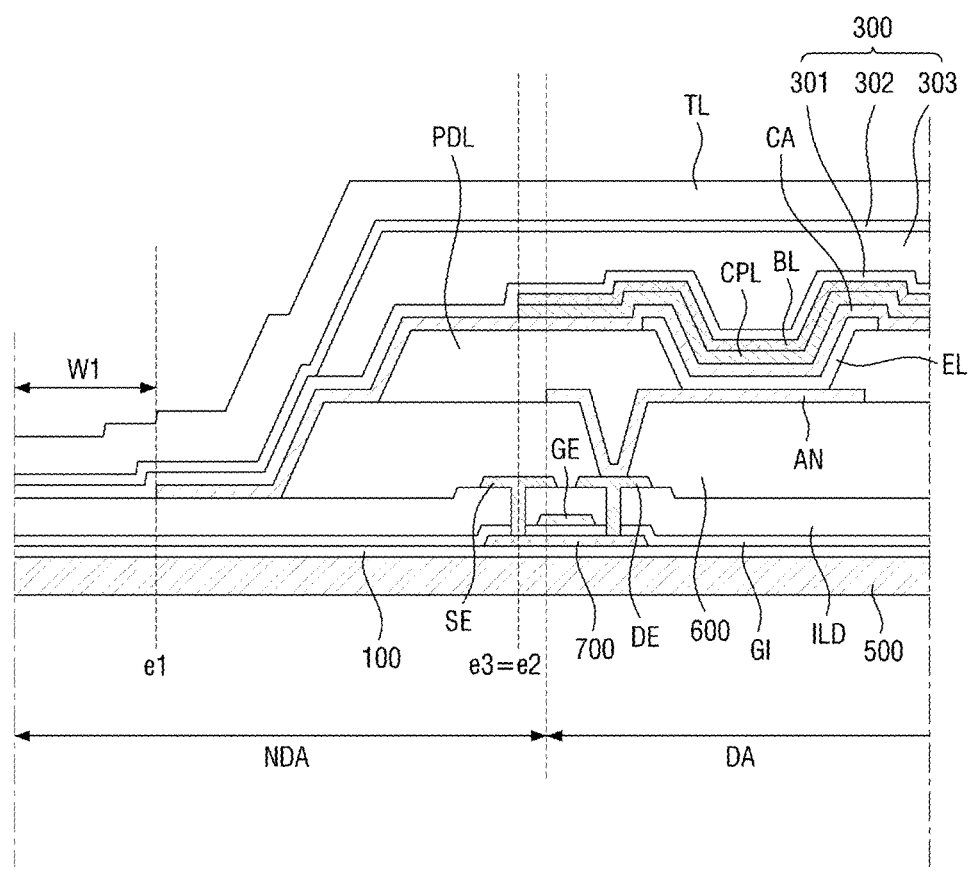
FIG. 6 is a cross-sectional view of a display device according to an exemplary embodiment.

FIG. 6 is a cross-sectional view of a display device according to an exemplary embodiment. Referring to FIG. 6, the display device according to this exemplary embodiment is different from the display device according to the exemplary embodiment of FIG. 3 in that an end e2 of a capping layer CPL is aligned with an end e3 of a protective layer BL.

In this exemplary embodiment, the end e2 of the capping layer CPL may be aligned with the end e3 of the protective layer BL. In this case, the end e2 of the capping layer CPL and the end e3 of the protective layer BL may be arranged in a non-display area NDA while being aligned with each other. In addition, compared with the exemplary embodiment of FIG. 3, the capping layer CPL may expose more of a cathode CA. Accordingly, an area in which the cathode CA directly contacts a first inorganic film 301 may be larger in FIG. 6 than in FIG. 3.

Figure 7:
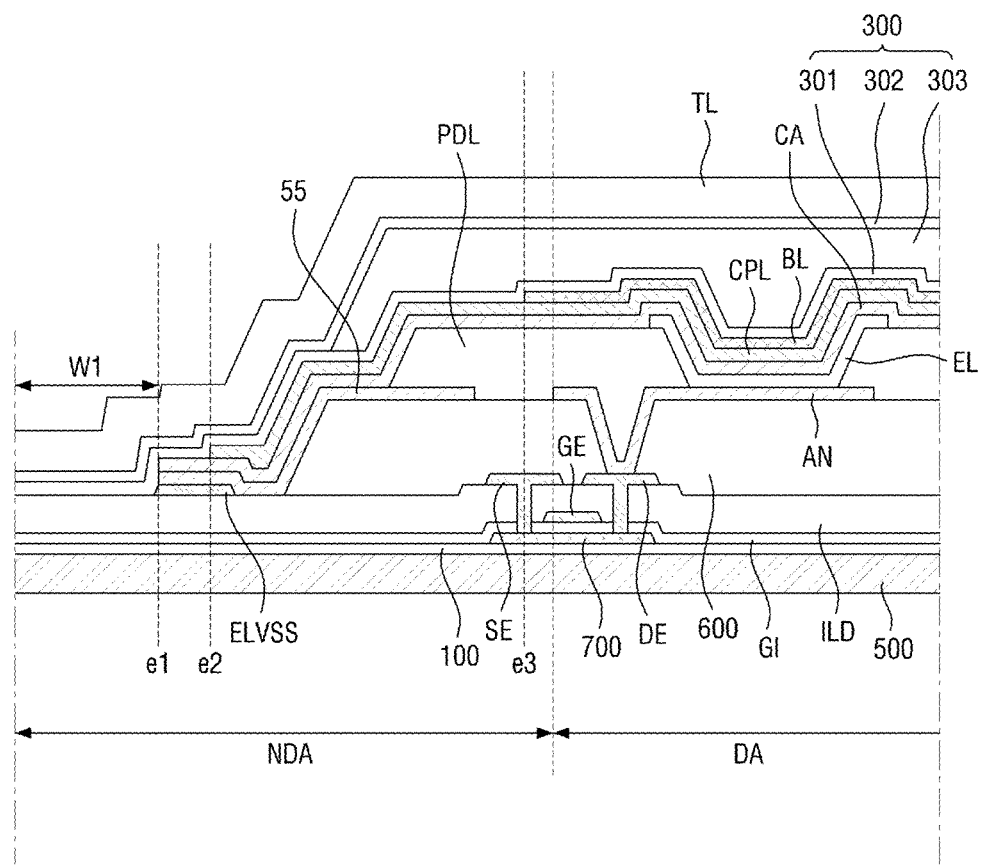
FIG. 7 is a cross-sectional view of a display device according to an exemplary embodiment.

FIG. 7 is a cross-sectional view of a display device according to an exemplary embodiment.

Referring to FIG. 7, the display device according to this exemplary embodiment is different from the display device according to the exemplary embodiment of FIG. 3 in that it further includes a driving voltage line ELVSS and a connection electrode 55.

In this exemplary embodiment, the driving voltage line ELVSS may be disposed on a substrate 500. The driving voltage line ELVSS may be electrically connected to a cathode CA and may provide a driving voltage to the cathode CA. The connection electrode 55 may be disposed on the driving voltage line ELVSS. The connection electrode 55 may be made of the same material as an anode AN in a display area DA. In other words, the connection electrode 55 may be formed at the same time as the anode AN in the same process. However, the inventive concept is not limited to this case, and the connection electrode 55 may be formed independently of the anode AN.

The cathode CA may be disposed on the connection electrode 55. That is, the cathode CA may directly contact the connection electrode 55. Accordingly, the driving voltage line ELVSS and the cathode CA may be electrically connected to each other.

In an exemplary embodiment, a capping layer CPL may partially overlap the driving voltage line ELVSS. Even in this case, an end e2 of the capping layer CPL may be disposed further inside than an end e1 of the cathode CA.

Figure 8:
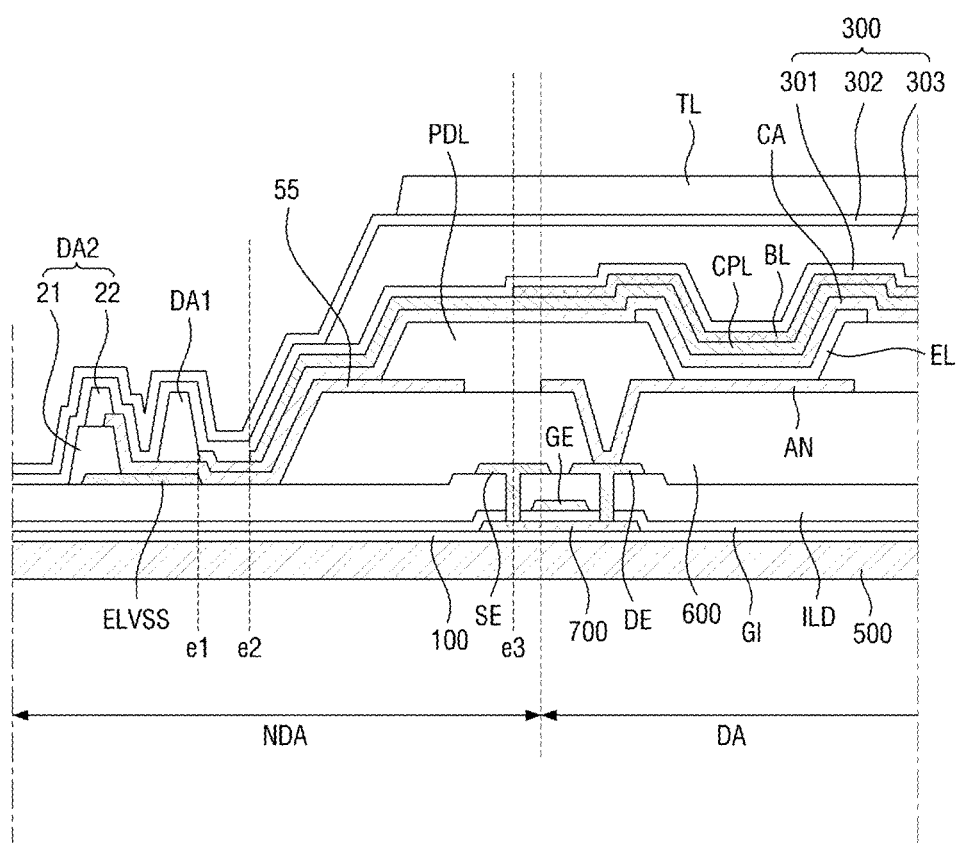
FIG. 8 is a cross-sectional view of a display device according to an exemplary embodiment.

FIG. 8 is a cross-sectional view of a display device according to an exemplary embodiment. Referring to FIG. 8, the display device according to this exemplary embodiment is different from the display device according to the exemplary embodiment of FIG. 7 in that it further includes a first dam DA1 and a second dam DA2 disposed in a non-display area NDA.

The first dam DA1 and the second dam DA2 may be separated from each other and disposed in the non-display area NDA.

In an exemplary embodiment, the first dam DA1 may be made of the same material as a pixel defining layer PDL in a display area DA. That is, the first dam DA1 may be disposed on the same layer as the pixel defining layer PDL. In an embodiment, the first dam DA1 may be formed at the same time as the pixel defining layer PDL in the same process. However, in an embodiment, the first dam DA1 may also be formed separately from the pixel defining layer PDL.

The first dam DA1 may at least partially overlap a driving voltage line ELVSS and a connection electrode 55, the second dam DA2 may be disposed outside the first dam DA1, and the second dam DA2 may at least partially overlap the driving voltage line ELVSS.

In an exemplary embodiment, the second dam DA2 may include a first layer 21 and a second layer 22. The first layer 21 may be made of the same material as a passivation film 600 of the display area DA, and the second layer 22 may be made of the same material as the pixel defining layer PDL of the display area DA. A portion of the connection electrode 55 may be disposed between the first layer 21 and the second layer 22. In other words, a lower surface of the second layer 22 may directly contact the first layer 21 and the connection electrode 55.

In an exemplary embodiment in which the display device includes the first dam DA1 and the second dam DA2, a cathode CA and a capping layer CPL may be disposed inside the first dam DA1, an end e1 of the cathode CA may contact the first dam DA1, and an end e2 of the capping layer CPL may not contact the first dam DA1. Accordingly, the capping layer CPL may at least partially expose the cathode CA.

A first inorganic film 301 may directly contact the first dam DA1 and the second dam DA2. That is, the first inorganic film 301 may be formed beyond the first dam DA1 and the second dam DA2. Accordingly, an end of the first inorganic film 301 may be disposed outside the second dam DA2.

A second inorganic film 302 may be formed beyond the first dam DA1 and the second dam DA2. Accordingly, an end of the second inorganic film 302 may also be disposed outside the second dam DA2.

Hereinafter, methods of manufacturing a display device according to exemplary embodiments will be described. Some of the elements described below may be the same as those of the display devices according to the above-described embodiments, and thus a description of the elements will be omitted in order to avoid redundancy.

Figure 9:
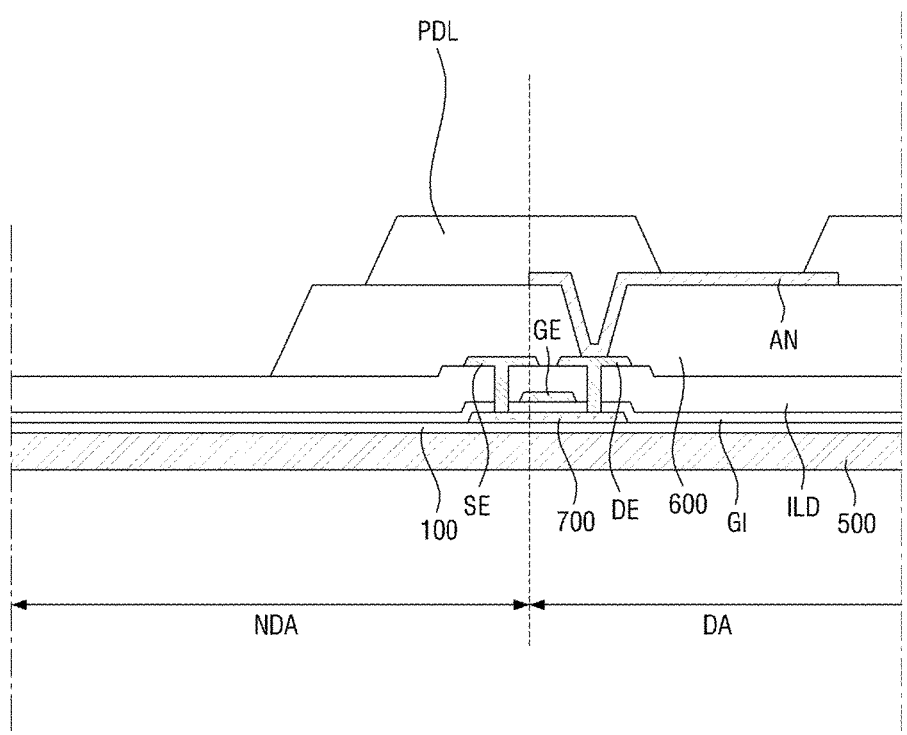
FIG. 9 is a cross-sectional view illustrating a method of manufacturing a display device according to an exemplary embodiment.
Figure 10:
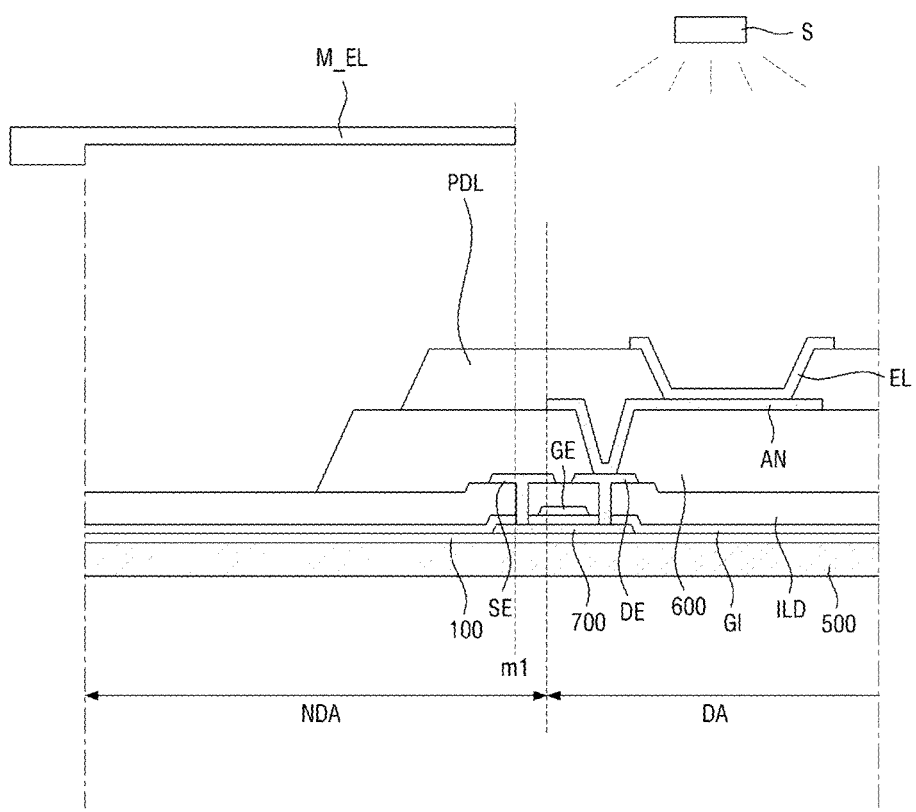
FIG. 10 is a cross-sectional view illustrating the method of manufacturing a display device according to an exemplary embodiment.
Figure 11:
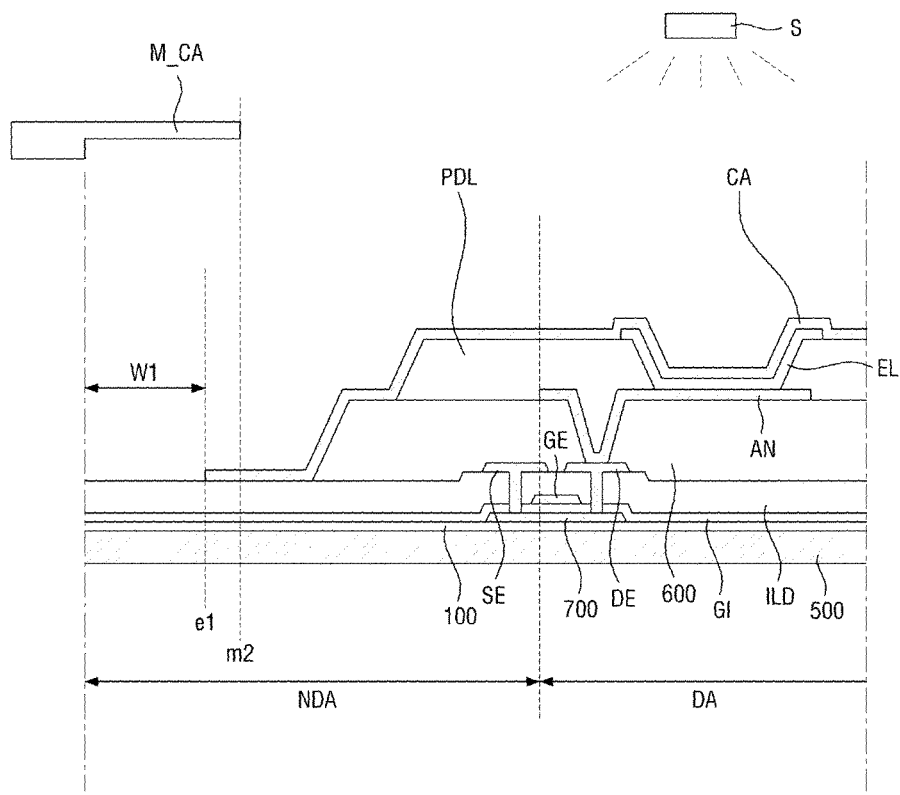
FIG. 11 is a cross-sectional view illustrating the method of manufacturing a display device according to an exemplary embodiment.
Figure 12:
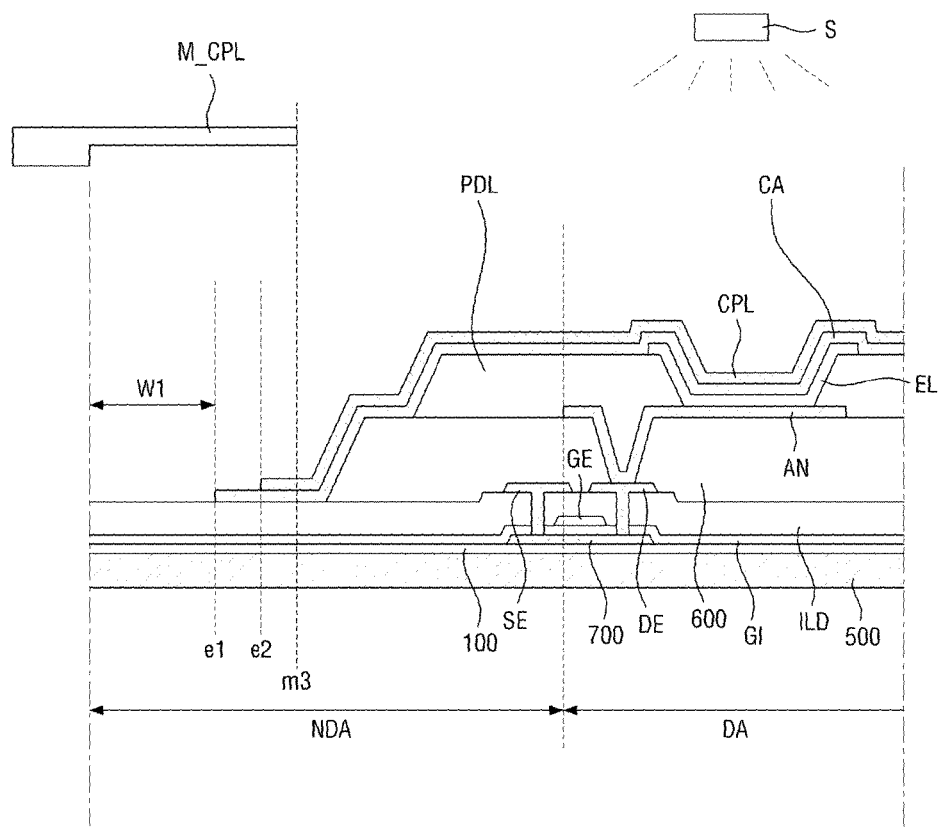
FIG. 12 is a cross-sectional view illustrating method of manufacturing a display device according to an exemplary embodiment.
Figure 13:
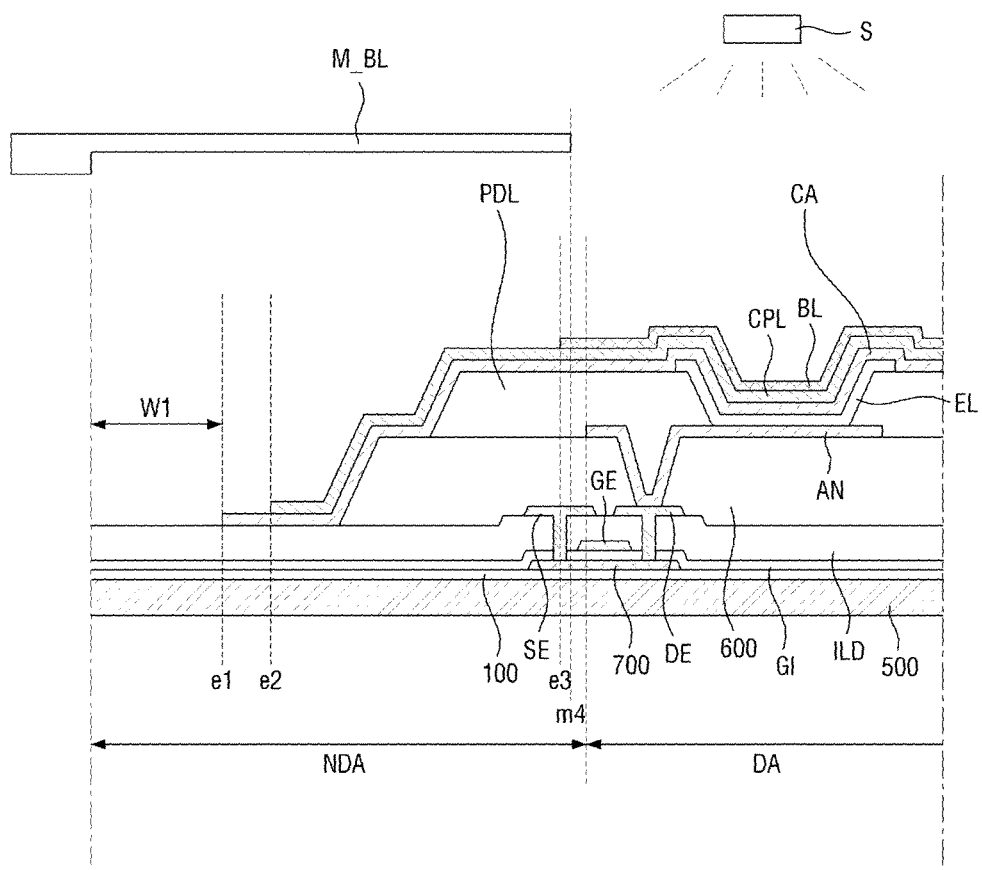
FIG. 13 is a cross-sectional view illustrating the method of manufacturing a display device according to an exemplary embodiment.
Figure 14:
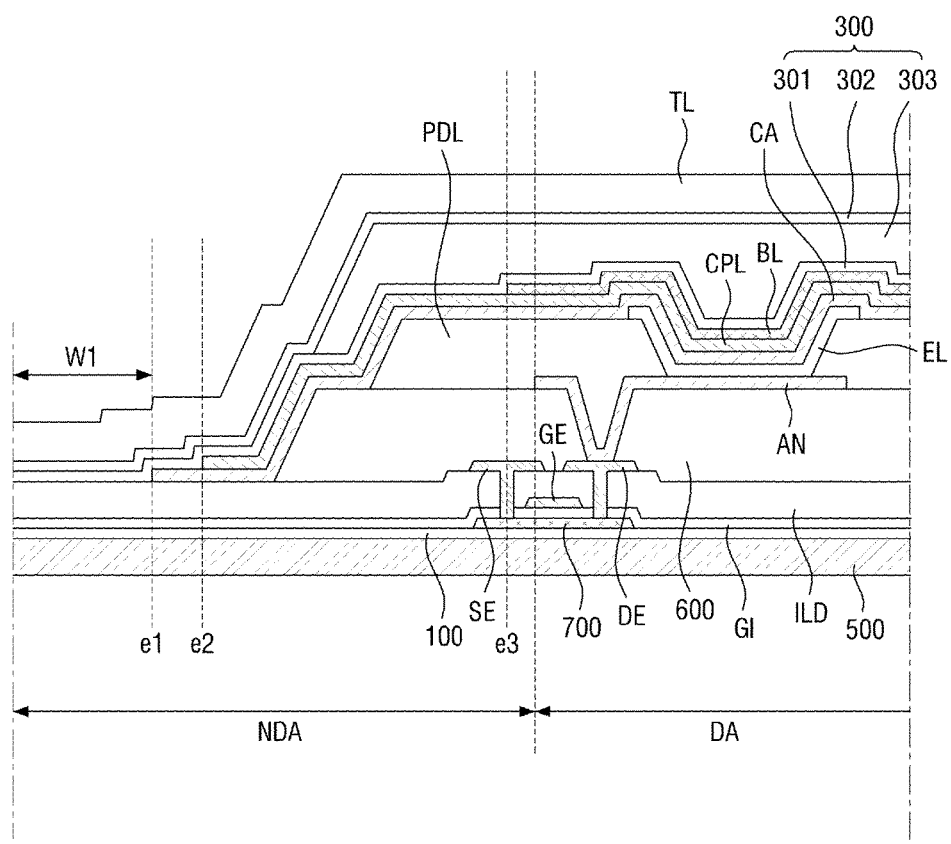
FIG. 14 is a cross-sectional view illustrating the method of manufacturing a display device according to an exemplary embodiment.

FIG. 9 is a cross-sectional view illustrating a method of manufacturing a display device according to an exemplary embodiment. FIG. 10 is a cross-sectional view illustrating the method of manufacturing a display device according to the exemplary embodiment. FIG. 11 is a cross-sectional view illustrating the method of manufacturing a display device according to the exemplary embodiment. FIG. 12 is a cross-sectional view illustrating the method of manufacturing a display device according to the exemplary embodiment. FIG. 13 is a cross-sectional view illustrating the method of manufacturing a display device according to the exemplary embodiment. FIG. 14 is a cross-sectional view illustrating the method of manufacturing a display device according to the exemplary embodiment.

In FIGS. 9-14, the method of manufacturing a display device according to an embodiment includes preparing a substrate 500 which has an interlayer insulating film ILD, a passivation film 600 and an anode AN and in which a display area DA and a non-display area NDA are defined, forming an intermediate layer EL on the anode AN, forming a cathode CA on the intermediate layer EL, forming a capping layer CPL on the cathode CA, and forming an encapsulation film 300 on the capping layer CPL.

Referring first to FIG. 9, the substrate 500 which has the interlayer insulating film ILD, the passivation film 600 and the anode AN and in which the display area DA and the non-display area NDA are defined may be prepared. The interlayer insulating film ILD, the passivation film 600, the anode AN, the display area DA, the non-display area NDA, and the substrate 500 may be substantially the same as those described above in the display devices according to exemplary embodiments, and thus a detailed description of these elements will be omitted.

Next, referring to FIG. 10, the intermediate layer EL may be formed on the anode AN. In an exemplary embodiment, the intermediate layer EL may be formed by chemical vapor deposition (CVD).

Specifically, a source unit S for providing a source to the substrate 500 may be placed to face the substrate 500. A mask may be placed between the source unit S and the substrate 500. In an embodiment, the mask may be a micro-slit mask. In other words, the mask may include a blocking portion which blocks a material provided from the source unit S and an open portion. In addition, the open portion may include a plurality of patterns. In this specification, an end of the mask refers to an outermost boundary of the open portion, and the same definition may be applied to various masks described below.

Referring again to FIG. 10, an intermediate layer mask M_EL may be placed between the source unit S and the substrate 500.

When the source unit S provides a deposition material in a state where the intermediate layer mask M_EL is in place, the intermediate layer EL may be formed on the substrate 500.

An end m1 of the intermediate layer mask M_EL may be placed in the non-display area NDA. Accordingly, although not illustrated in FIG. 10, a dummy organic layer (not illustrated) made of the same material as the intermediate layer EL may be placed between the end m1 of the intermediate layer mask M_EL and an end of the intermediate layer EL.

Next, referring to FIG. 11, the cathode CA may be formed on the intermediate layer EL.

In an exemplary embodiment, the cathode CA may be formed by CVD, and a cathode mask M_CA may be placed between the source unit S and the substrate 500.

When the source unit S provides a deposition material in a state where the cathode mask M_CA is in place, the cathode CA may be formed on the substrate 500.

An end m2 of the cathode mask M_CA may be placed in the non-display area NDA.

In an exemplary embodiment, an end e1 of the cathode CA may be disposed further outside than the end m2 of the cathode mask M_CA. This may be because the deposition material is spread sideways since the cathode mask M_CA and the substrate 500 are separated from each other. However, the end e1 of the cathode CA may also be aligned with the end m2 of the cathode mask M_CA.

Referring now to FIG. 12, the capping layer CPL may be formed on the cathode CA.

In an exemplary embodiment, the capping layer CPL may be formed by CVD, and a capping layer mask M_CPL may be placed between the source unit S and the substrate 500.

When the source unit S provides a deposition material in a state where the capping layer mask M_CPL is in place, the capping layer CPL may be formed on the substrate 500. An end m3 of the capping layer mask M_CPL may be placed in the non-display area NDA.

In an exemplary embodiment, an end e2 of the capping layer CPL may be disposed further outside than the end m3 of the capping layer mask M_CPL. This may be due to a tolerance between the capping layer mask M_CPL and the substrate 500 in the deposition process as described above. However, the end e2 of the capping layer CPL may also be aligned with the end m3 of the capping layer mask M_CPL.

Next, referring to FIG. 13, the method of manufacturing a display device according to an exemplary embodiment may further include forming a protective layer BL on the capping layer CPL.

In an exemplary embodiment, the protective layer BL may be formed by CVD.

Referring to FIG. 13, a protective layer mask M_BL may be placed between the substrate 500 and the source unit S. When the source unit S provides a deposition material in a state where the protective layer mask M_BL is in place, the protective layer BL may be formed on the substrate 500. An end m4 of the protective layer mask M_BL may be placed in the non-display area NDA. The protective layer BL may be placed to completely cover the intermediate layer EL. The end m4 of the protective layer mask M_BL may be placed further inside than an end e3 of the protective layer BL. This may be due to a tolerance between the protective layer mask M_BL and the substrate 500 in the deposition process. However, the end m4 of the protective layer mask M_BL and the end e3 of the protective layer BL may also be aligned with each other.

Referring to FIG. 14, the encapsulation film 300 may be formed on the capping layer CPL.

Generally, an ashing process for partially removing the capping layer CPL is performed after the formation of the capping layer CPL. However, methods of manufacturing a display device according to embodiments may not include the ashing process. That is, since a sufficient contact area can be ensured by partially exposing the cathode CA through the capping layer CPL, the ashing process may be omitted. Therefore, a phenomenon such as corrosion that may occur in the ashing process may be prevented.

The encapsulation film 300 may include a first inorganic film 301, a first organic film 303, and a second inorganic film 302. The first inorganic film 301, the first organic film 303, and the second inorganic film 302 may be substantially the same as those described above in the display devices according to the exemplary embodiments.

In an exemplary embodiment, the first inorganic film 301 and the second inorganic film 302 may be formed by CVD. The first inorganic film 301 may be formed on the entire surface of the substrate 500. Accordingly, the first inorganic film 301 may directly contact the cathode CA, the capping layer CPL and the interlayer insulating film ILD. Since the encapsulation film 300 is substantially the same as those described above in the display devices according to the exemplary embodiments, a detailed description of the encapsulation film 300 will be omitted.

The method of manufacturing a display device according to the exemplary embodiment may further include forming a touch layer TL on the encapsulation film 300. The touch layer TL may be substantially the same as that described above in the display device according to the exemplary embodiment of FIG. 3. Therefore, a detailed description of the touch layer TL will be omitted.

Figure 15:
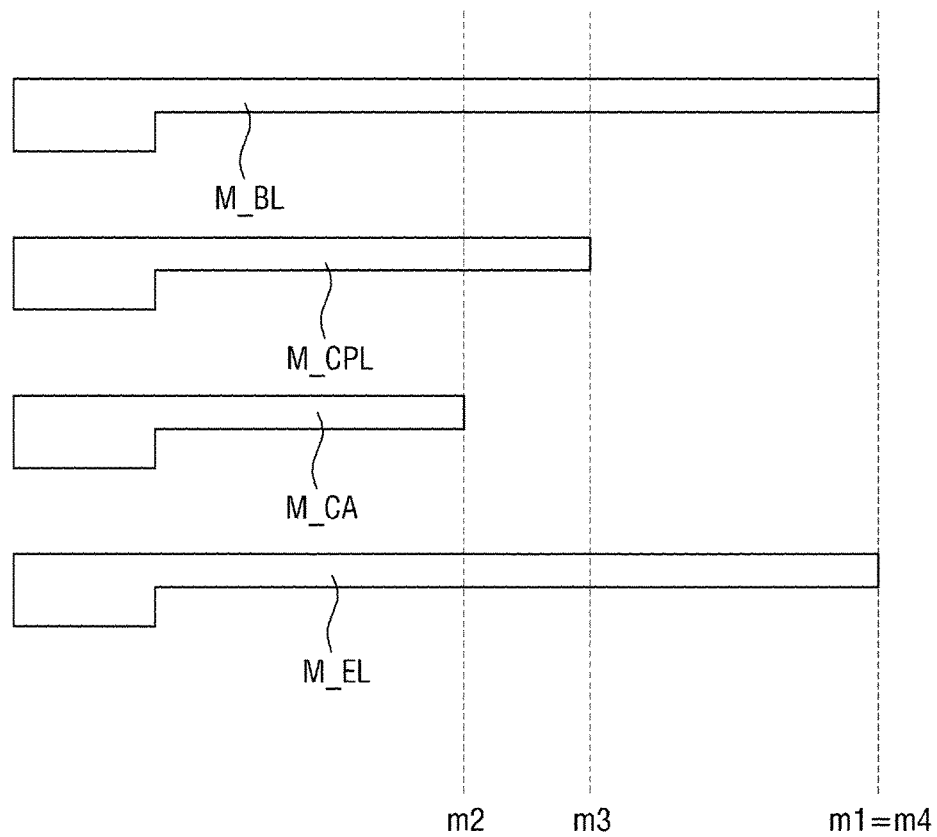
FIG. 15 is a conceptual diagram illustrating a method of manufacturing a display device according to an exemplary embodiment.

FIG. 15 is a conceptual diagram illustrating a method of manufacturing a display device according to an exemplary embodiment.

In FIG. 15, relative relationships among a protective layer mask M_BL, a capping layer mask M_CPL, a cathode mask M_CA, and an intermediate layer mask M_EL disposed on a substrate 500 are illustrated.

In an exemplary embodiment, an end m4 of the protective layer mask M_BL and an end m1 of the intermediate layer mask M_EL may coincide with each other. In this case, a protective layer BL may completely cover an intermediate layer EL. An end m3 of the capping layer mask M_CPL and an end m2 of the cathode mask M_CA may be disposed further outside than the end m4 of the protective layer mask M_BL. The end m2 of the cathode mask M_CA may be disposed further outside than the end m3 of the capping layer mask M_CPL. Accordingly, an end e1 of a cathode CA may be disposed further outside than an end e2 of a capping layer CPL. In other words, the capping layer CPL may at least partially expose the cathode CA.

When the masks having the relationships of FIG. 15 are used, the display device according to the exemplary embodiment of FIG. 3 can be realized.

Figure 16:
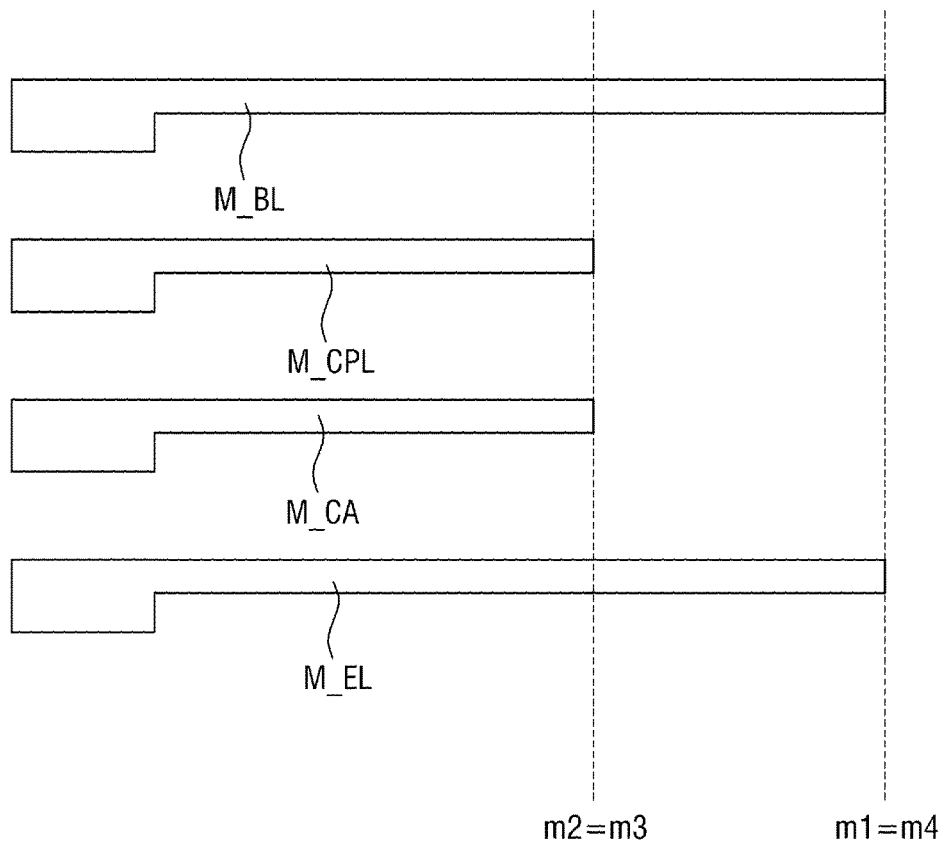
FIG. 16 is a conceptual view illustrating a method of manufacturing a display device according to an exemplary embodiment.

FIG. 16 is a conceptual view illustrating a method of manufacturing a display device according to an exemplary embodiment.

Referring to FIG. 16, in the current exemplary embodiment, an end m2 of a cathode mask M_CA and an end m3 of a capping layer mask M_CPL may coincide with each other. In this case, an end e1 of a cathode electrode CA and an end e2 of a capping layer CPL may be aligned with each other. That is, when the masks having the relationships of FIG. 16 are used, the display device according to the exemplary embodiment of FIG. 5 can be realized.

Figure 17:
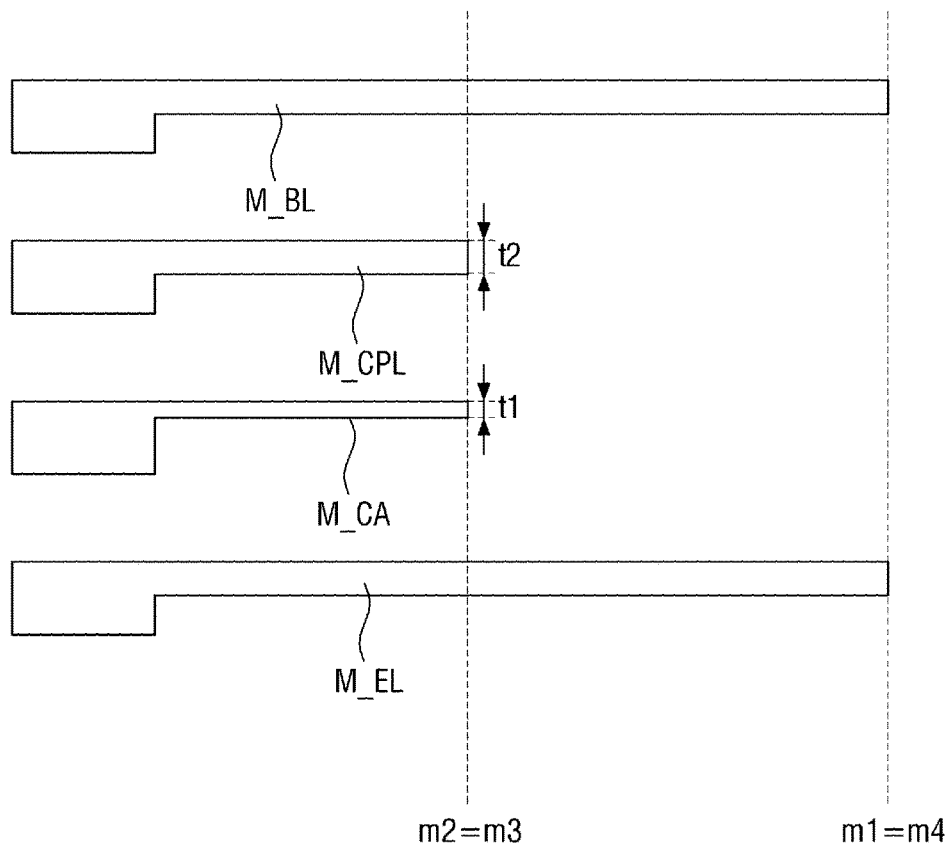
FIG. 17 is a conceptual diagram illustrating a method of manufacturing a display device according to an exemplary embodiment.

FIG. 17 is a conceptual diagram illustrating a method of manufacturing a display device according to an exemplary embodiment.

Referring to FIG. 17, the method of manufacturing a display device according to the current embodiment is different from the method according to the exemplary embodiment of FIG. 16 in that an end m2 of a cathode mask M_CA and an end m3 of a capping layer mask M_CPL coincide with each other, but a thickness of the cathode mask M_CA is smaller than that of the capping layer mask M_CPL.

In an exemplary embodiment, the cathode mask M_CA may have a first thickness t1, and the capping layer mask M_CPL may have a second thickness t2. The first thickness t1 may be smaller than the second thickness t2.

When the cathode mask M_CA is thin, a deposition material may be more likely to spread sideways. Accordingly, an end e1 of a cathode CA may be disposed further outside than an end e2 of a capping layer CPL. In other words, the capping layer CPL may at least partially expose the cathode CA. That is, when the masks having the relationships of FIG. 17 are used, the display device according to the exemplary embodiment of FIG. 3 can be realized.

Figure 18:
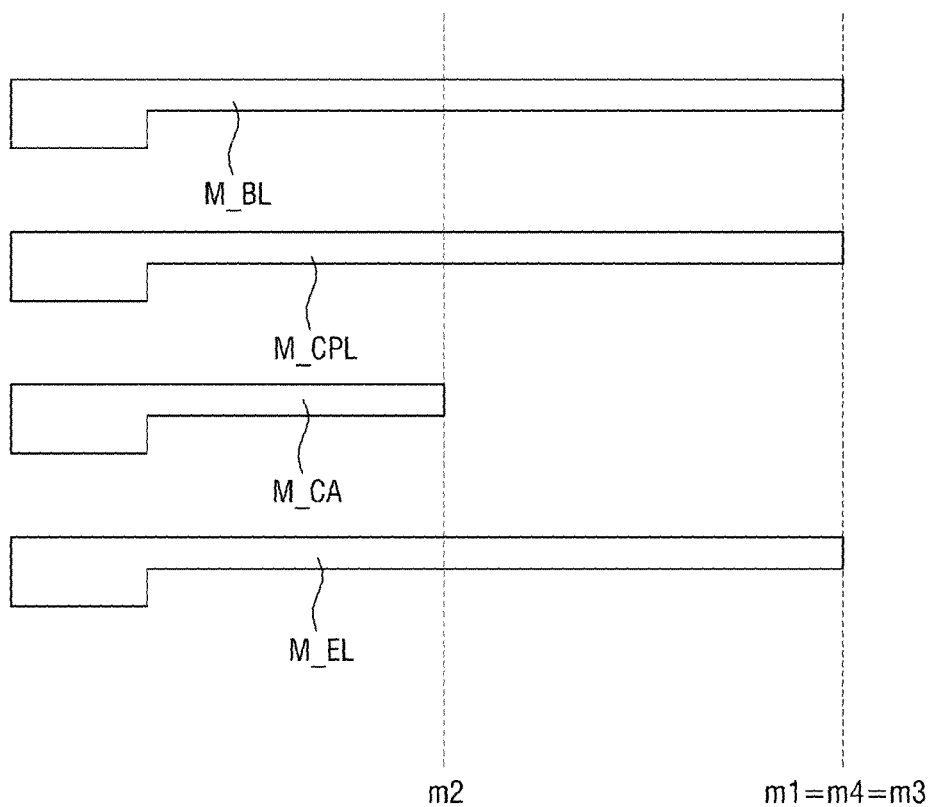
FIG. 18 is a conceptual diagram illustrating a method of manufacturing a display device according to an exemplary embodiment.

FIG. 18 is a conceptual diagram illustrating a method of manufacturing a display device according to an exemplary embodiment.

Referring to FIG. 18, the method of manufacturing a display device according to the current embodiment is different from the method according to the exemplary embodiment of FIG. 15 in that an end m4 of a protective layer mask M_BL, an end m1 of an intermediate layer mask M_EL, and an end m3 of a capping layer mask M_CPL coincide with each other.

When the end m4 of the protective layer mask M_BL coincides with the end m3 of the capping layer mask M_CPL, an end e3 of a protective layer BL and an end e2 of a capping layer CPL may be aligned with each other. That is, when the masks having the relationships in FIG. 18 are used, the display device according to the exemplary embodiment of FIG. 6 may be realized.

Embodiments of the inventive concept provide at least one of the following advantages in that adhesion between an encapsulation film and a substrate in a display device may be stably maintained.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
    a substrate in which a display area and a non-display area disposed outside the display area are defined;
    an interlayer insulating film disposed on the substrate;
    a passivation film disposed on the interlayer insulating film;
    an anode disposed on the passivation film;
    an intermediate layer disposed on the anode;
    a cathode disposed on the intermediate layer;
    a capping layer disposed on the cathode; and
    an encapsulation film disposed on the capping layer, wherein the encapsulation film directly contacts the interlayer insulating film, the cathode, and the capping layer in the non-display area.

2. The display device of claim 1, wherein an end of the cathode is disposed further outside than an end of the capping layer.

3. The display device of claim 1, further comprising a protective layer which is disposed on the capping layer and overlaps the intermediate layer.

4. The display device of claim 3, wherein the end of the capping layer is aligned with an end of the protective layer.

5. The display device of claim 1, wherein the encapsulation film comprises:
a first inorganic film;
a first organic film disposed on the first inorganic film; and
a second inorganic film disposed on the first organic film.

6. The display device of claim 5, wherein the first inorganic film directly contacts the cathode, the capping layer, and the interlayer insulating film.

7. The display device of claim 6, wherein a width by which the first inorganic film and the interlayer insulating film contact each other is in the range of 50 to 300 µm.

8. The display device of claim 6, wherein the second inorganic film directly contacts the first inorganic film and the interlayer insulating film.

9. The display device of claim 1, further comprising a touch layer which is disposed on the encapsulation film.

10. The display device of claim 1, wherein the end of the capping layer and the end of the cathode are aligned with each other.

11. The display device of claim 1, further comprising a driving voltage line and a connection electrode disposed on the substrate.

12. The display device of claim 1, further comprising a first dam and a second dam which are disposed in the non-display area and separated from each other.

13. The display device of claim 12, wherein the end of the cathode is located inside the first dam.

14. The display device of claim 12, wherein the second dam comprises a first layer and a second layer disposed on the first layer.

* * * * *